US007989895B2

(12) United States Patent  
White et al.

(10) Patent No.: US 7,989,895 B2
(45) Date of Patent: Aug. 2, 2011

(54) INTEGRATION USING PACKAGE STACKING WITH MULTI-LAYER ORGANIC SUBSTRATES

(75) Inventors: George E. White, Marietta, GA (US); Sidharth Dalmia, Norcross, GA (US)

(73) Assignee: AVX Corporation, Fountain Inn, SC (US)

( * ) Notice: Subject to any disclaimer, the term of this patent is extended or adjusted under 35 U.S.C. 154(b) by 605 days.

(21) Appl. No.: 11/940,952

(22) Filed: Nov. 15, 2007

(65) Prior Publication Data

US 2008/0111226 A1    May 15, 2008

Related U.S. Application Data

(60) Provisional application No. 60/866,049, filed on Nov. 15, 2006.

(51) Int. Cl.
  *H01L 21/02* (2006.01)
(52) U.S. Cl. ............... 257/379; 257/532; 257/E27.009; 438/171
(58) Field of Classification Search .................. 257/678, 257/700, E27.009, E27.113, E27.114, 528, 257/773; 455/90; 438/393; 174/260; 361/311
See application file for complete search history.

(56) References Cited

U.S. PATENT DOCUMENTS

| 4,745,215 A | 5/1988 | Cox et al. |
| 4,824,381 A | 4/1989 | Hertzberg et al. |
| 5,106,461 A | 4/1992 | Volfson et al. |
| 5,162,257 A | 11/1992 | Yung |
| 5,247,377 A | 9/1993 | Omeis et al. |
| 5,270,493 A | 12/1993 | Inoue et al. |
| 5,323,128 A | 6/1994 | Ishizaki et al. |
| 5,329,695 A | 7/1994 | Traskos et al. |
| 5,349,314 A | 9/1994 | Shimizu et al. |
| 5,373,271 A | 12/1994 | Hirai et al. |
| 5,384,434 A | 1/1995 | Mandai et al. |

(Continued)

FOREIGN PATENT DOCUMENTS

EP    0510971 B1    10/1992

(Continued)

OTHER PUBLICATIONS

Son, M. H., Low-Cost Realization of ISM Band Pass Filters Using Integrated Combine Structures, 2000.

(Continued)

*Primary Examiner* — Matthew E Warren
*Assistant Examiner* — Fang-Xing Jiang
(74) *Attorney, Agent, or Firm* — Dority & Manning, P.A.

(57) ABSTRACT

Example embodiments of the invention may provide for a multi-package system. The multi-package system may include a first package having a plurality of first organic dielectric layers, where the first package includes at least one first conductive layer positioned between two of the plurality of first organic dielectric layers, and where the at least one first conductive layer is circuitized to form at least one first passive device. The multi-package system may also include a second package having a plurality of second organic dielectric layers, where the second package includes at least one second conductive layer positioned between two of the plurality of second organic dielectric layers, and where the at least one second conductive layer is circuitized to form at least one second passive device. An electrical connector may be provided between a bottom surface of the first package and a top surface of the second package to electrically connect the first package and the second package.

11 Claims, 7 Drawing Sheets

U.S. PATENT DOCUMENTS

| | | | |
|---|---|---|---|
| 5,396,201 A | 3/1995 | Ishizaki et al. | |
| 5,401,913 A | 3/1995 | Gerber et al. | |
| 5,416,454 A | 5/1995 | McVeety | |
| 5,450,290 A | 9/1995 | Boyko et al. | |
| 5,497,337 A | 3/1996 | Ponnapalli et al. | |
| 5,517,751 A | 5/1996 | Bross et al. | |
| 5,521,564 A | 5/1996 | Kaneko et al. | |
| 5,532,667 A | 7/1996 | Haertling et al. | |
| 5,545,916 A | 8/1996 | Koullias | |
| 5,559,360 A | 9/1996 | Chiu et al. | |
| 5,610,433 A | 3/1997 | Merrill et al. | |
| 5,635,892 A | 6/1997 | Ashby et al. | |
| 5,654,681 A | 8/1997 | Ishizaki et al. | |
| 5,668,511 A | 9/1997 | Furutani et al. | |
| 5,679,414 A | 10/1997 | Akashi et al. | |
| 5,703,544 A | 12/1997 | Hays, III | |
| 5,716,663 A | 2/1998 | Capote et al. | |
| 5,719,354 A | 2/1998 | Jester et al. | |
| 5,719,539 A | 2/1998 | Ishizaki et al. | |
| 5,720,898 A | 2/1998 | Nohira et al. | |
| 5,739,193 A | 4/1998 | Walpita et al. | |
| 5,770,986 A | 6/1998 | Tonegawa et al. | |
| 5,801,100 A | 9/1998 | Lee et al. | |
| 5,818,313 A | 10/1998 | Estes et al. | |
| 5,844,299 A | 12/1998 | Merrill et al. | |
| 5,917,244 A | 6/1999 | Lee et al. | |
| 5,955,931 A | 9/1999 | Kaneko et al. | |
| 5,999,243 A | 12/1999 | Kameyama et al. | |
| 6,005,197 A | 12/1999 | Kola et al. | |
| 6,008,102 A | 12/1999 | Alford et al. | |
| 6,021,050 A | 2/2000 | Ehman et al. | |
| 6,026,286 A | 2/2000 | Long | |
| 6,031,727 A | 2/2000 | Duesman et al. | |
| 6,040,226 A | 3/2000 | Wojnarowski et al. | |
| 6,051,289 A | 4/2000 | Tsujimoto et al. | |
| 6,079,100 A | 6/2000 | Farquhar et al. | |
| 6,093,599 A | 7/2000 | Lee et al. | |
| 6,114,925 A | 9/2000 | Lo | |
| 6,127,905 A | 10/2000 | Horie | |
| 6,153,290 A | 11/2000 | Sunahara | |
| 6,166,799 A | 12/2000 | Kageyama et al. | |
| 6,171,716 B1 | 1/2001 | Sasaki et al. | |
| 6,177,853 B1 | 1/2001 | Nagatomi et al. | |
| 6,191,666 B1 | 2/2001 | Sheen | |
| 6,191,669 B1 | 2/2001 | Shigemura | |
| 6,225,696 B1 | 5/2001 | Hathaway et al. | |
| 6,249,962 B1 | 6/2001 | Bergstedt | |
| 6,255,714 B1 | 7/2001 | Kossives et al. | |
| 6,259,037 B1 | 7/2001 | Feilchenfeld et al. | |
| 6,259,148 B1 | 7/2001 | Bartush et al. | |
| 6,261,872 B1 | 7/2001 | Hathaway et al. | |
| 6,281,430 B1 | 8/2001 | Lupo et al. | |
| 6,287,931 B1 | 9/2001 | Chen | |
| 6,303,423 B1 | 10/2001 | Lin | |
| 6,333,469 B1 | 12/2001 | Inoue et al. | |
| 6,380,608 B1 | 4/2002 | Bentley | |
| 6,395,374 B1 | 5/2002 | McAndrew et al. | |
| 6,421,225 B2 | 7/2002 | Bergstedt | |
| 6,445,266 B1 | 9/2002 | Nagatomi et al. | |
| 6,492,886 B1 | 12/2002 | Kushitani et al. | |
| 6,528,732 B1 | 3/2003 | Okubora et al. | |
| 6,583,687 B2 | 6/2003 | Nosaka | |
| 6,586,686 B1 | 7/2003 | Enomoto et al. | |
| 6,617,681 B1 * | 9/2003 | Bohr | 257/700 |
| 6,625,037 B2 | 9/2003 | Nakatani et al. | |
| 6,630,630 B1 | 10/2003 | Maezawa et al. | |
| 6,713,162 B2 | 3/2004 | Takaya et al. | |
| 6,759,600 B2 | 7/2004 | Koyama et al. | |
| 6,900,708 B2 | 5/2005 | White et al. | |
| 6,987,307 B2 | 1/2006 | White et al. | |
| 7,652,347 B2 * | 1/2010 | Yang | 257/528 |
| 2001/0004228 A1 | 6/2001 | Hirai et al. | |
| 2001/0016980 A1 | 8/2001 | Bergstedt | |
| 2001/0050599 A1 | 12/2001 | Maekawa et al. | |
| 2002/0008301 A1 | 1/2002 | Liou et al. | |
| 2002/0048930 A1 | 4/2002 | Lin | |
| 2002/0049042 A1 * | 4/2002 | Oida et al. | 455/90 |
| 2002/0064701 A1 | 5/2002 | Hand et al. | |
| 2002/0064922 A1 | 5/2002 | Lin | |
| 2002/0074158 A1 | 6/2002 | St. Lawrence et al. | |
| 2002/0076538 A1 | 6/2002 | St. Lawrence et al. | |
| 2002/0081443 A1 | 6/2002 | Connelly et al. | |
| 2002/0157864 A1 | 10/2002 | Koyama et al. | |
| 2002/0158305 A1 | 10/2002 | Dalmia et al. | |
| 2002/0170748 A1 * | 11/2002 | Larson | 174/260 |
| 2002/0172021 A1 | 11/2002 | Seri et al. | |
| 2002/0195270 A1 | 12/2002 | Okubora et al. | |
| 2003/0011960 A1 * | 1/2003 | Koning et al. | 361/311 |
| 2004/0000425 A1 | 1/2004 | White et al. | |
| 2004/0000701 A1 | 1/2004 | White et al. | |
| 2004/0000968 A1 | 1/2004 | White et al. | |
| 2004/0021218 A1 * | 2/2004 | Hayama et al. | 257/700 |
| 2004/0034489 A1 | 2/2004 | Ogino et al. | |
| 2004/0113752 A1 | 6/2004 | Schuster | |
| 2004/0124513 A1 * | 7/2004 | Ho et al. | 257/678 |
| 2005/0248418 A1 | 11/2005 | Govind et al. | |
| 2006/0017152 A1 | 1/2006 | White et al. | |
| 2006/0071341 A1 * | 4/2006 | Kim et al. | 257/773 |
| 2007/0010064 A1 * | 1/2007 | Das et al. | 438/393 |

FOREIGN PATENT DOCUMENTS

| | | |
|---|---|---|
| EP | 0645952 A1 | 3/1995 |
| EP | 0506476 B1 | 6/1996 |
| EP | 1235235 A1 | 8/2002 |
| EP | 1411553 A1 | 4/2004 |
| JP | 09130103 A2 | 5/1997 |
| WO | 0195679 A1 | 12/2001 |
| WO | 0197582 A1 | 12/2001 |
| WO | 200508490 A2 | 1/2005 |

OTHER PUBLICATIONS

Matijasevic, G., MCM-L Substrates Fabricated Using Patterned TLPS Conductive Composites, 1997, International Conference on Multichip Modules, Apr. 2, 1997, pp. 64-69.

Charles, H.K., Packaging With Multichip Modules, 1992 IEEE/CHMT International Electronics Manufacturing Technology Symposium, pp. 206-210.

Min, S.H., Design, Fabrication, Measurement and Modeling of Embedded Inductors in Laminate Technology, ASME International Electronics Packaging Technical Conference and Exhibition, Jul. 8-13, 2001, pp. 1-5.

Dalmia, S., Modeling RF Passive Circuits Using Coupled Lines and Scalable Models, 2001, Electronic Components and Technology Conference, pp. 816-823.

Kanetaka, T.M., Display from INSPEC, Dec. 4, 2002, www.stneasy.org.tmp.

Loke, A.L.S., Evaluation of Copper Penetration in Low-k Polymer Dielectrics by Bias-Temperature Stress, MRS Spring Meeting, Symposium N/O, Paper O4.4, San Francisco, CA, Apr. 7, 1999.

Wang, A Full-Wave Analysis Model for Uniplanar Circuits with Lumped Elements, IEEE Transactions on Microwave Theory and Techniques, vol. 51, No. 1, Jan. 2003.

Flexible Printed Circuit-YFLEX, Patent Abstracts of Japan, vol. 1995, No. 09, Oct. 31, 1995, www.yamaichi.us/ yflex.html.

Hong, J.S., Microstrip Filters for RF/Microwave Applications, Wiley-Interscience Publication, 2001, pp. 121-159.

* cited by examiner

INTEGRATION USING PACKAGE STACKING WITH MULTI-LAYER ORGANIC SUBSTRATES

RELATED APPLICATIONS

This application claims benefit of U.S. Provisional Application No. 60/866,049, filed Nov. 15, 2006, and entitled "Systems, Methods, and Apparatuses for Integration Using Package Stacking for Global Universal Radio Units," which is hereby incorporated by reference in its entirety.

FIELD OF THE INVENTION

Embodiments of the invention relate generally to systems, methods, and apparatuses for multi-layer organic substrates, and more particularly, to integration using package stacking with the multi-layer organic substrates.

BACKGROUND OF THE INVENTION

There are currently a number of challenges in the integration of multiple functional components into small sizes or form factors. An example may be desired integration of multiple radios supporting multiple modes or bands of operation into a small size or form factor. For instance, a PDA, mobile phone, or laptop may need the following: (1) Cellular operation supporting quad band GSM, CDMA, PCS, WCDMA; (2) Location and emergency based devices such as GPS; (3) hands free voice operation using Bluetooth; (4) Internet connectivity using WLAN; (5) high data rate using WIMAX; (6) Mobile TV using DVB-H; and (7) cable-free operation using UWB. Accordingly, there is a need in the industry for a cost-effective and highly integrated performance platform.

SUMMARY OF THE INVENTION

According to an example embodiment of the invention, there is a multi-package system. The multi-package system may include a first package having a plurality of first organic dielectric layers, where the first package includes at least one first conductive layer positioned between two of the plurality of first organic dielectric layers, and wherein the at least one first conductive layer is circuitized to form at least one first passive device. The multi-package system may also include a second package having a plurality of second organic dielectric layers, where the second package includes at least one second conductive layer positioned between two of the plurality of second organic dielectric layers, and where the at least one second conductive layer is circuitized to form at least one second passive device. The multi-package system may further include an electrical connector positioned between a bottom surface of the first package and a top surface of the second package, where the first package is electrically connected to the second package via the electrical connector.

According to another embodiment of the invention, there is another multi-package system. The multi-package system may include a first package having a plurality of first organic dielectric layers, where the first package includes at least one first conductive layer positioned between two of the plurality of first organic dielectric layers, and where the at least one first conductive layer is circuitized to form at least one first passive device. The multi-package system may also include a second package having a plurality of second organic dielectric layers, where the second package includes at least one second conductive layer positioned between two of the plurality of second organic dielectric layers, and where the at least one second conductive layer is circuitized to form at least one second passive device. The multi-package system may also include means for electrically connecting the first package to the second package.

BRIEF DESCRIPTION OF THE DRAWINGS

Figure 1:
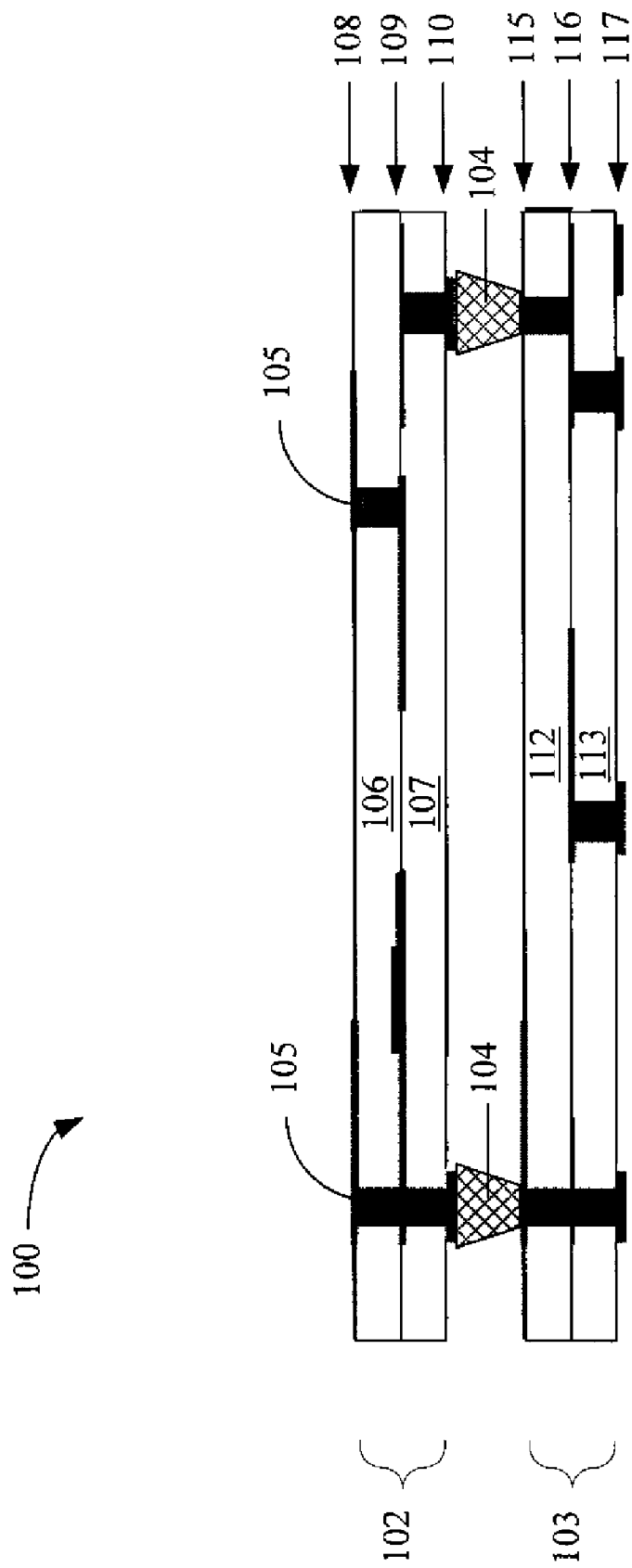

Having thus described the invention in general terms, reference will now be made to the accompanying drawings, which are not necessarily drawn to scale, and wherein:

FIG. 1 illustrates an example of a simplified multi-package system 100, according to an example embodiment of the invention.

Figure 2:
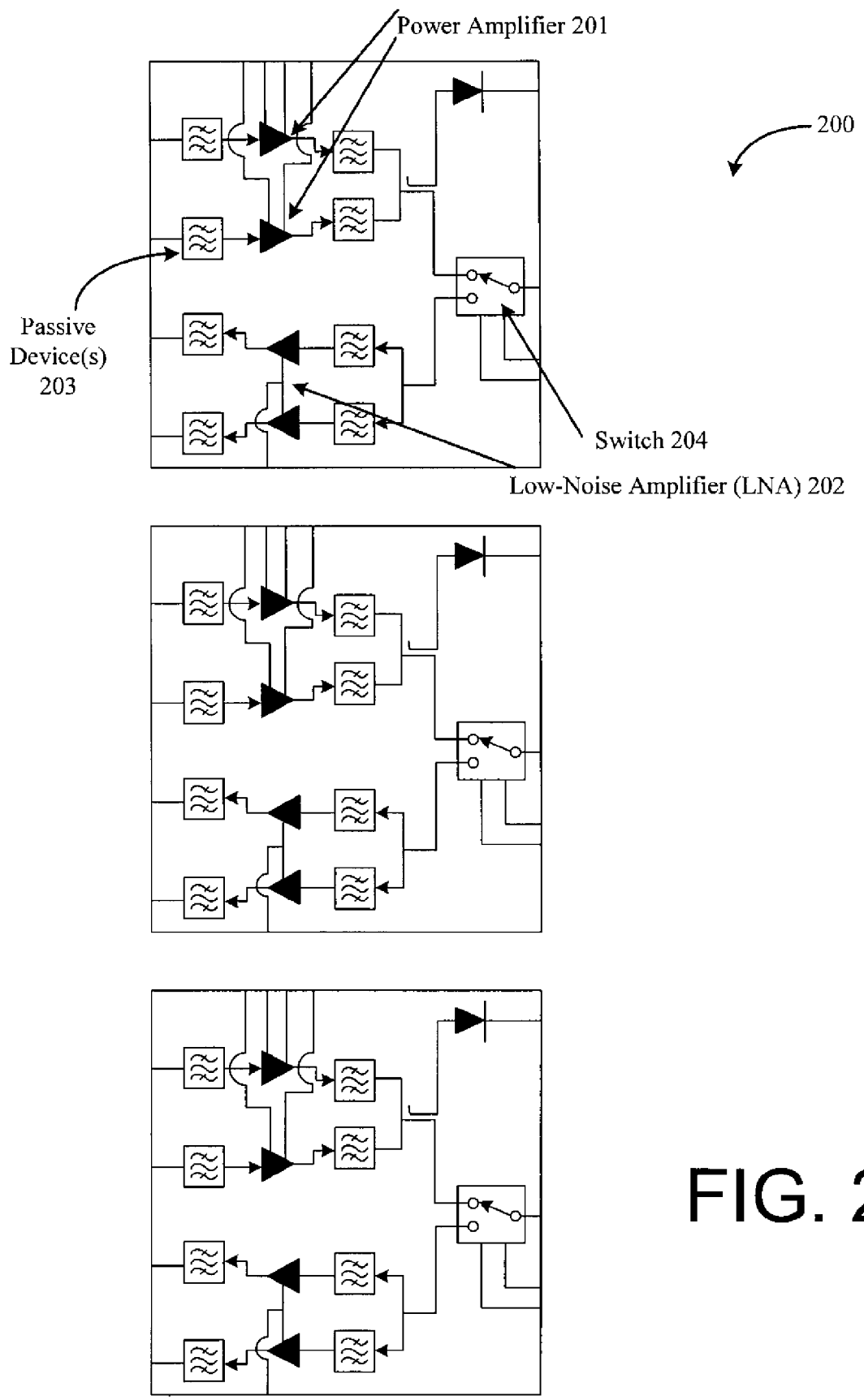

FIG. 2 illustrates a schematic diagram of a radio front-end circuitry 200 that may be implemented using an multi-package system, according to an example embodiment of the invention.

Figure 3:
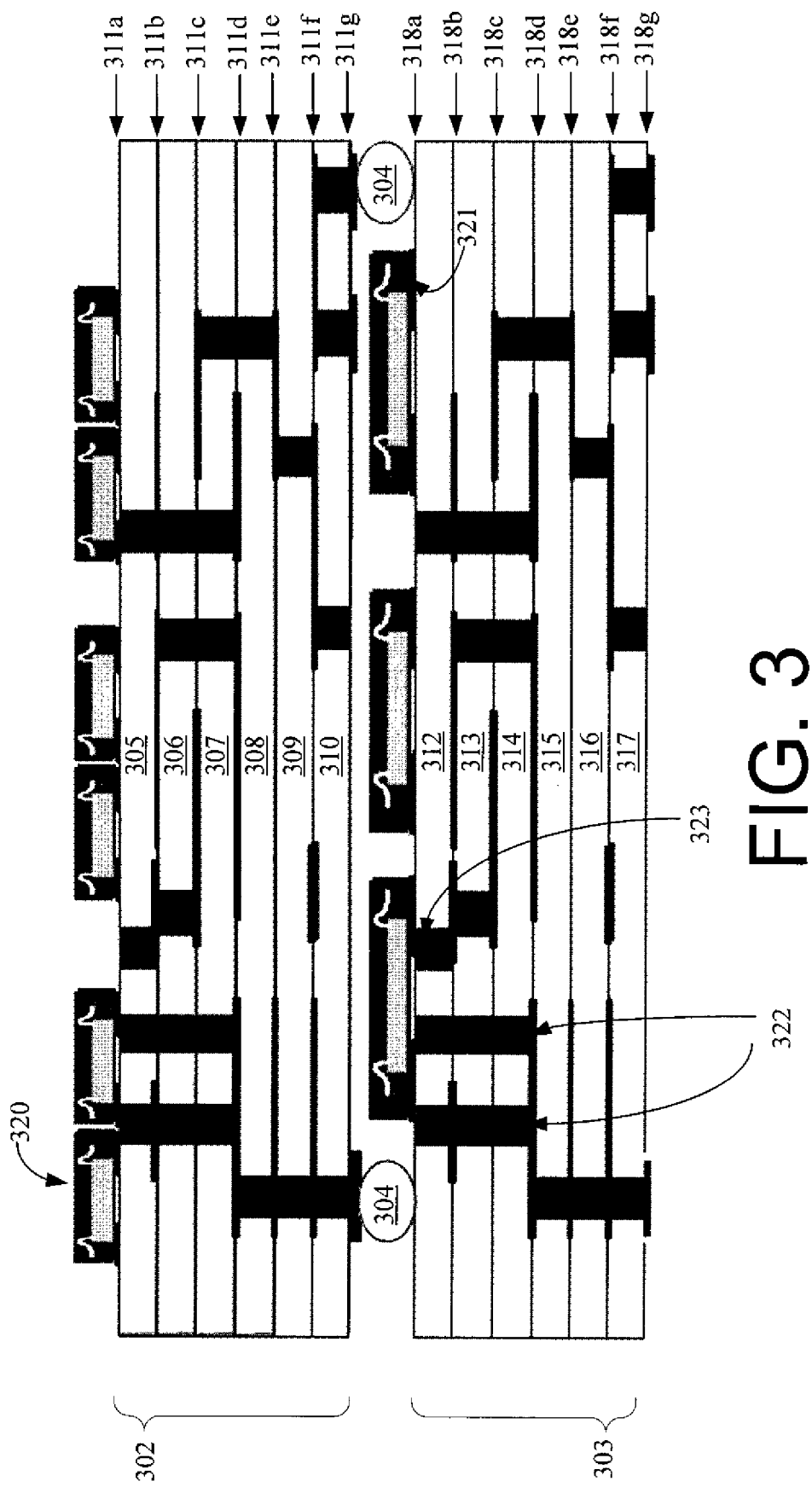

FIG. 3 illustrates an example multi-package system 300 for implementing a radio front-end circuitry, according to an example embodiment of the invention.

Figure 4:
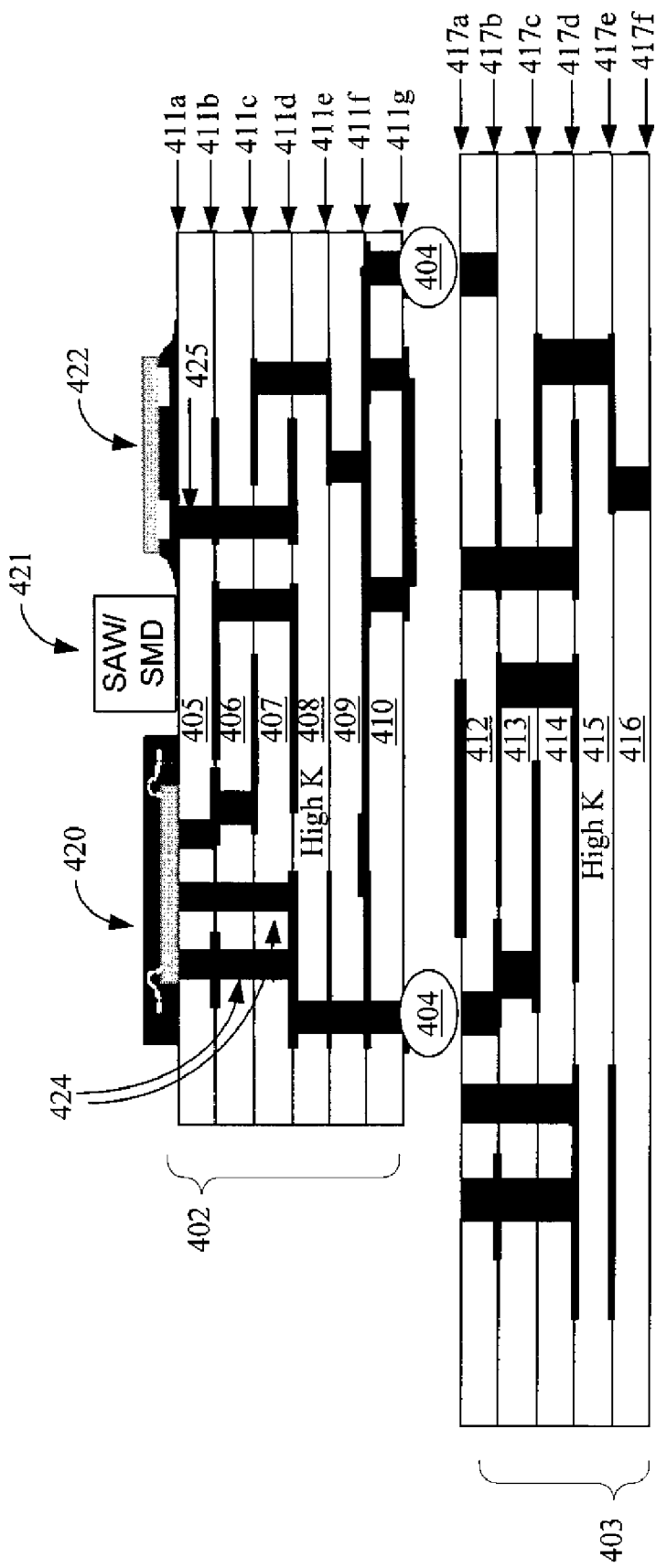

FIG. 4 illustrates a modular way of integration in a multi-package system, in accordance with an embodiment of the present invention.

Figure 5:
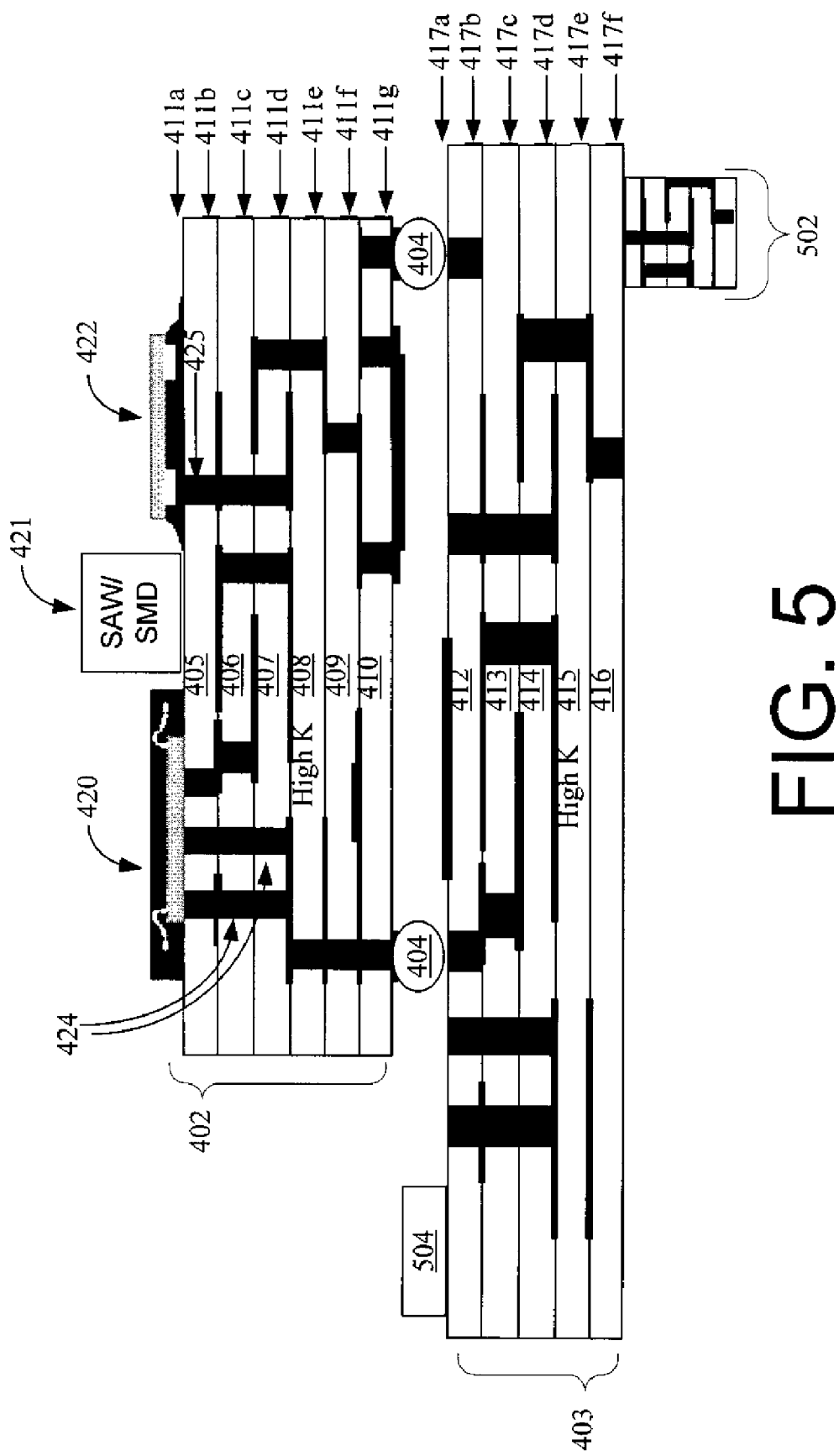

FIG. 5 shows an example embodiment of the invention where a package is attached on an outer surface of intelligent carrier/printed circuit board, according to an example embodiment of the invention.

Figure 6:
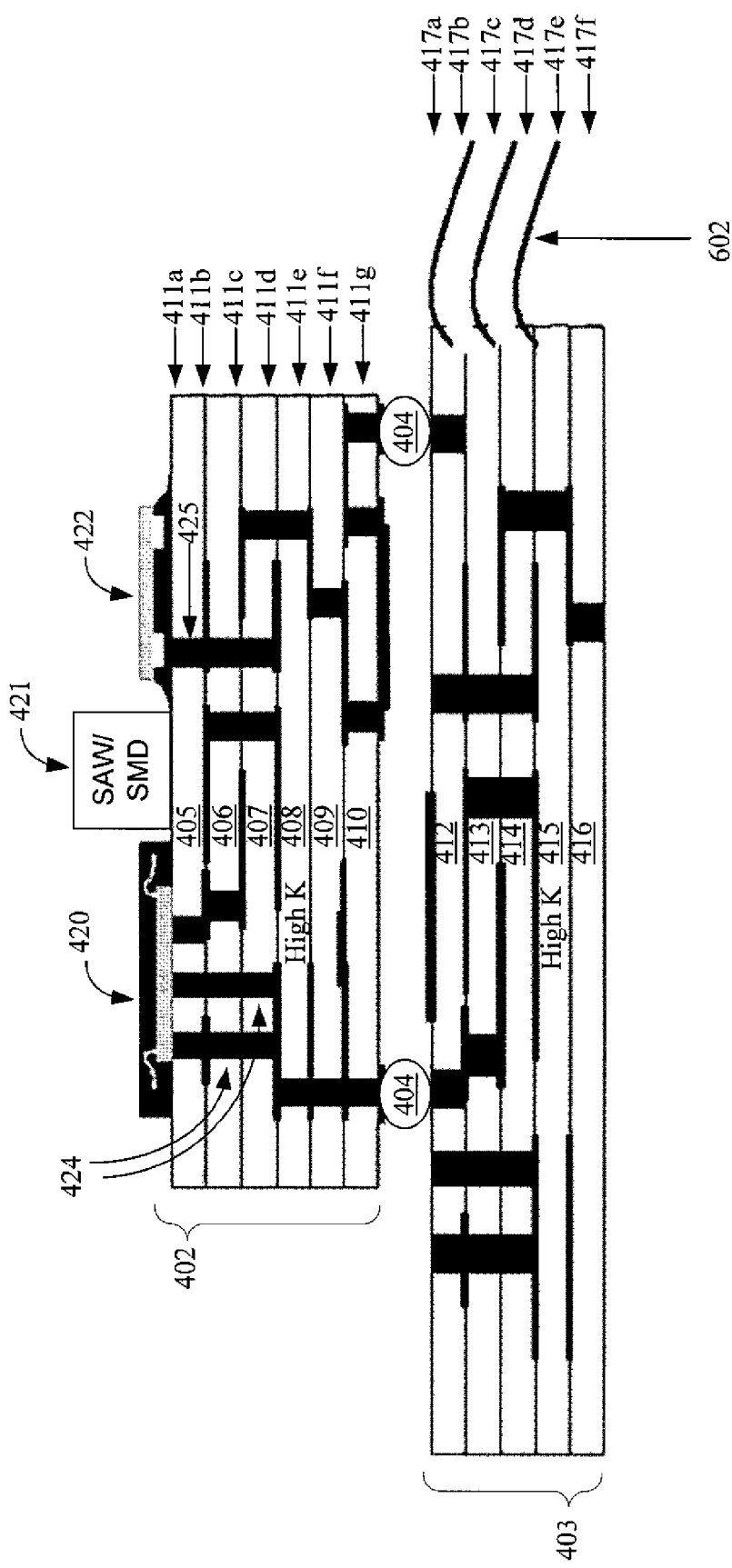

FIG. 6 shows an exemplary rigid flex embodiment of the invention, according to an example embodiment of the invention.

Figure 7:
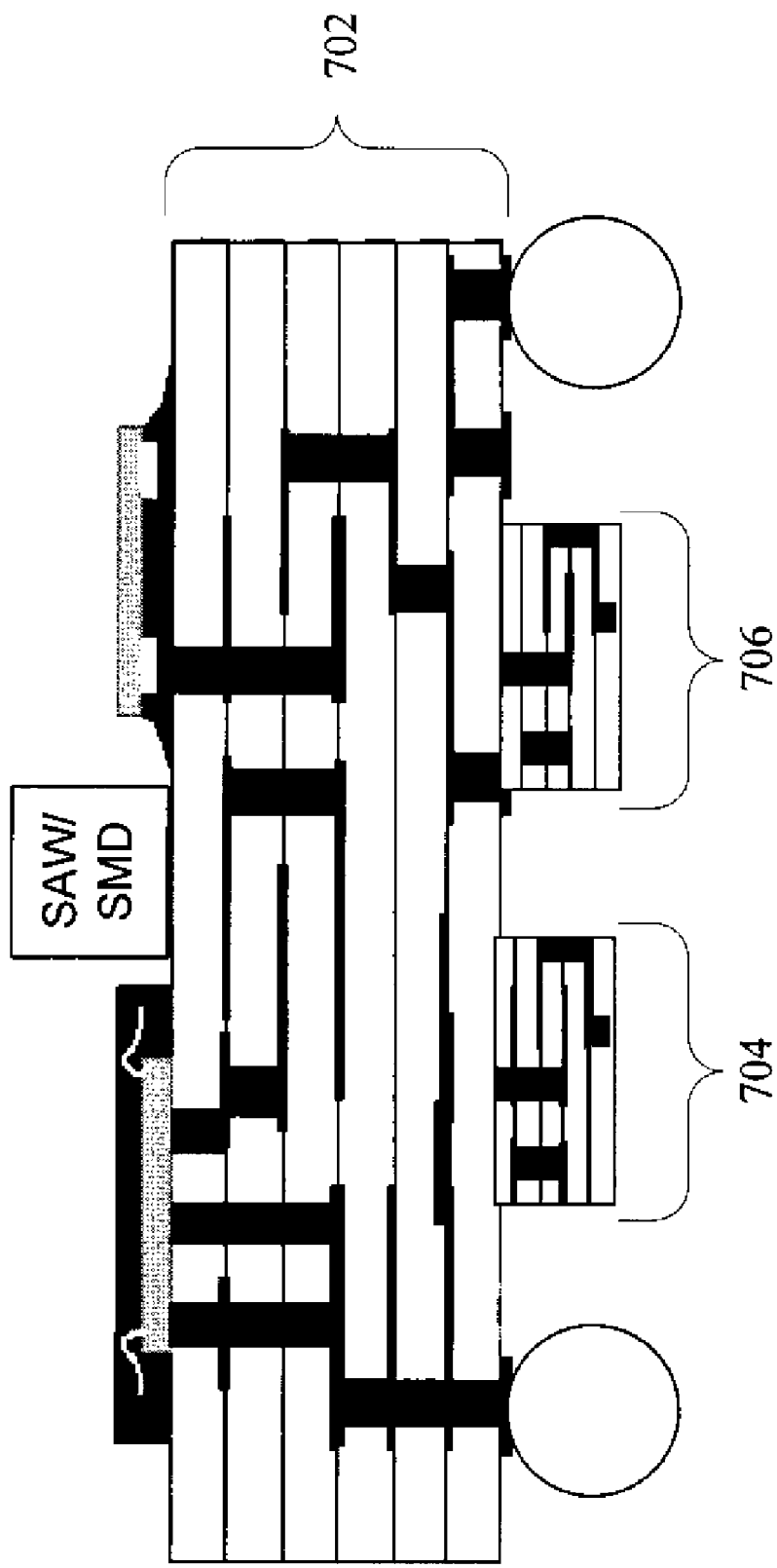

FIG. 7 illustrates a package that is surface mounted to a bottom side of a first package, according to an example embodiment of the present invention.

DESCRIPTION OF THE INVENTION

Embodiments of the invention will now be described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements. Like numbers refer to like elements throughout.

Example embodiments of the invention may provide for the integration or stacking of multiple packages to provide for a multi-package system. The multi-package system may be a compact, high-performing system, according to an example embodiment of the invention. A multi-package system in accordance with an example embodiment of the invention may be utilized for or otherwise support a variety of radio frequency (RF) applications, including a global universal radio unit, which may provide for multiple radios or bands of operation within the multi-package system. For example, a global universal radio unit may provide for Quad band GSM, WCDMA, GPS, 2×2 WLAN 802.11n, 2×2 802.16e, Bluetooth, DVB-H, and 3×3 multiple-input multiple-output (MIMO) WLAN, according to an example embodiment of the invention. It will be appreciated, however, that the global radio system may support additional or other radios or bands of operation without departing from embodiments of the invention.

I. Overview of Multi-Package System

FIG. 1 illustrates an example of a simplified multi-package system 100, according to an example embodiment of the present invention. The simplified multi-package system 100, or a variation thereof, may be utilized for implementing the global radio system described above or other radio frequency (RF) components and systems, according to an example embodiment of the invention. As shown in FIG. 1, there may be a first package 102 having at least organic dielectric layers 106, 107 and a second package 103 having at least organic dielectric layers 112, 113. The first package 102 may be electrically connected to the second package 103 using one or more electrical connectors 104, which may include pre-formed studs or stud bumps, solder balls, solder joints, and yet other connectors of various sizes and finishes. In an example embodiment of the invention, the electrical connectors 104 may be copper stud bumps. According to an example embodiment of the invention, the use of the studs or stud bumps, solder balls, or solder joints may provide for a near hermetic seal between the first package 102 and the second package 103, which may eliminate a need for overmold.

The first package 102 may include a plurality of conductive layers such as conductive layers 108, 109, 110 that are positioned adjacent to organic dielectric layers 106, 107, as shown in FIG. 1. Likewise, the second package 103 may include a plurality of conductive layers such as conductive layers 1115, 116, 117 that are positioned adjacent to organic dielectric dielectric layers. The conductive layers 108-110, 115-117 may be formed of a variety of metals or conductive materials, including copper, gold, silver, nickel, a combination thereof, and the like. One or more of the conductive layers 108-110, 115-117 may serve as a ground plane, a voltage supply plane for active component, or otherwise patterned or circuitized to form pads, traces, and passive devices such as capacitors (e.g., a parallel plate capacitor), inductors, and resistors, according to an example embodiment of the invention. Indeed, one or more of the passive devices may be embedded within the first package 102, perhaps using one or more inner conductive layers such as inner conductive layer 109. Likewise, one or more of the passive devices may be embedded within the second package 103, perhaps using one or more inner conductive layers such as inner conductive layer 116. Example of integrating or embedding passive devices within organic layers may be described in U.S. Pat. Nos. 6,900,708 and 7,260,890, both of which are incorporated by reference. In addition, the first package 102 and the second package 103 may also include vias 105, which may be operable for providing inter-layer connections between or among the conductive layers in a package. Accordingly, the vias 105 may be formed by drilling and filled or metallized (e.g., electroless plating) with a conductive material. Additionally, some of the vias 105 may also be thermal vias that are used to draw heat from active devices such as power amplifiers that may be formed on a surface of a package such as packages 102 and 103. According to an example embodiment of the invention, the thermal vias may be comprised of thermal paste.

The organic dielectric layers 106, 107, 112, 113 may be formed of organic materials such as liquid crystalline polymer (LCP), Teflon, FR4, epoxy, resin, polyphenyl ether (PPE) based materials, or yet other organic materials described in U.S. Pat. Nos. 6,900,708 and 7,260,890. According to an illustrative embodiment of the invention, one or more of the dielectric layers 106, 107, 112, 113 may have a dielectric constant (Er) of between approximately 2 and 100, a dielectric loss tangent of less than approximately 0.01, and a thickness of between approximately 10 microns and 1000 microns. Other embodiments of the invention may include dielectric layers with different dielectric constants, loss tangents, and/or thicknesses than those described above without departing from embodiments of the invention.

A selection of organic materials for organic dielectric layers 106, 107, 112, and 113 may vary depending on design and performance requirements, including size, density, and performance requirements of the constituent components. In general, low-loss organic materials such as LCP or Teflon (e.g., low-loss LCP or Teflon dielectric constant (Er) of .about.2-15 and with small loss tangent) may be utilized for supporting embedded circuitized passive components requiring higher precision or performance, including transmission (TX) filters, diplexers, triplexers, duplexers, multiplexers, couplers, harmonic filters and baluns, according to an example embodiment of the invention. On the other hand, higher-loss organic materials (for example, organic materials with dielectric constant of >20 and a large loss tangent) such as 3M's C-Play may be utilized for supporting embedded circuitized passive components requiring lesser precision or performance (e.g., a higher tolerance for variation), including decoupling capacitors, DC blocking capacitors, and receive, bandstop, notch (RX) filters (e.g., blocking filters), diplexers, triplexers, duplexers, multiplexers, couplers, harmonic filters and baluns. According to an example embodiment of the invention, these higher-loss organic materials may additionally include high K and resistive/ceramic particles to provide a high dielectric constant (e.g., to provide for higher density of components). As an example, these high K and resistive particles may include ceramic particles, Barium titinate, lead magnesium nitrate, or titatium dioxide, although other high K and resistive particles may be utilized without departing from embodiments of the invention. Indeed, a high K organic layer may be utilized to improve a performance of the decoupling capacitors and DC blocking capacitors. It will also be appreciated that alternative embodiments of the invention may utilized high K organic layers that are unfilled without departing from embodiments of the invention.

According to an example embodiment of the invention, the thickness of each of the organic dielectric layers 106, 107, 112, 113 may be determined based upon performance requirements of any embedded passive devices. For example, a thinner organic dielectric layer, perhaps around 10-15 microns thick, may be utilized for embedded passive devices that require lower precision or performance. On the other hand, a thick organic dielectric layer, perhaps around 45-50 microns thick, may be utilized for embedded passive devices that require a higher precision or performance.

According to an example embodiment of the invention, a global universal radio unit may be implemented using a plurality of packages similar to packages 102 and 103 of FIG. 1. For example, the first package 102 may be utilized for embedding components requiring higher precision and performance. According to an example embodiment of the invention, a very high performance may be obtained for the first package 102 by utilizing homogeneous organic materials for the organic dielectric layers 106 and 107. For example, both organic dielectric layers 106 and 107 may have similar electrical and mechanical properties, including dielectric constant, loss tangent, coefficient of thermal expansion, coefficient of thermal expansion (CTE), and modulus. The high-performance first package 102 may include embedded components (e.g., passive devices) such as TX filters, diplexers, triplexers, duplexers, multiplexers, couplers, harmonic filters and baluns. Likewise, the first package 102 may also include one or more surface mount components or devices such as amplifiers (e.g., power amplifiers).

On the other hand, the second package 103 having at least organic dielectric layers 112, 113 may be utilized for embedding components that do not require as high of a performance as those embedded in the first package 102. According to an example embodiment of the invention, the organic materials utilized by the organic dielectric layers may be heterogeneous. For example, a first organic dielectric layer may be formed of a high K organic material to enhance a performance of capacitors (e.g., DC blocking capacitors, decoupling capacitors). On the other hand, a second organic dielectric layer may be formed of low-loss organic material for circuit routing and other components that requiring lower loss operating conditions. Likewise, the second package 103 may also include one or more surface mount components or devices such as a transceiver chip or a low-noise amplifier (LNA).

II. Example Embodiment of a Global Universal Radio Implemented in a Multi-Package System FIG. 2 illustrates a schematic diagram of a radio front-end circuitry 200 that may be implemented using an multi-package system, according to an example embodiment of the invention. The radio front-end circuitry 200 of FIG. 2 may be utilized for a 3×3 multiple-input, multiple-output (MIMO) based dual band system, according to an example embodiment of the invention. Indeed, the radio front-end circuitry 200 may form at least a portion of the circuitry needed for a global universal radio unit. While not shown in FIG. 2, the radio front-end circuitry 200 may operate with one or more transceivers and one or more antennas.

The example radio front-end circuitry 200 of FIG. 2 may includes a variety active devices and passive devices 203. For example, the active components may include one or more transceivers and amplifiers such as power amplifiers (PAs) and low-noise amplifiers (LNAs). Likewise, the passive devices 203 may include antennas, baluns, filters (e.g., bandpass filters, harmonic filters, etc), and matching (M) circuits, which may be comprised of one or more inductors, capacitors, or resistors, according to an example embodiment of the invention. It will also be appreciated that other active and passive devices, including power detectors and power dividers, may also be provided for the radio front end circuitry 200.

FIG. 3 illustrates an example multi-package system 300 for implementing a radio front-end circuitry, according to an example embodiment of the invention. In FIG. 3, the multi-package system 300 may include a first package 302 and a second package 303. The first package 302 may include organic dielectric layers 305, 306, 307, 308, 309, 310 and the second package 303 may include organic dielectric layers 312, 313, 314, 315, 316, 317. The first package 302 may further include a plurality of conductive layers 311a-g and the second package 302 may also include a plurality of conductive layers 318a-g. One or more of the conductive layers 311a-g, 318a-g may be utilized to form ground planes, supply voltage planes, or patterned or circuitized to form pads, traces, and embedded passive devices such as capacitors, inductors, and resistors, as similarly discussed above. The first package 302 may be electrically connected to the second package via one or more electrical connectors 304. As described above, the electrical connectors 304 may include preformed studs or stud bumps (e.g., copper stud bumps), solder balls, solder joints, and yet other connectors of various sizes and finishes. In an alternative embodiment of the invention, cavities may be provided on a bottom surface of the first package 302 above the discrete components 321 such that the first package 302 may be electrically connected to the second package 303 using via connections. It will be appreciated that the cavities may be provided as similarly discussed in U.S. Patent Publication No. 2002/0017152, which is hereby incorporated by reference.

According to an example embodiment of the invention, transmission components of the radio front-end circuitry—for instance, embedded filters and baluns before and after a power amplifier—may be incorporated into the second package 303. As described above, conductive layers such as conductive layers 318a-g may be patterned or circuitized to form inductors, capacitors, and/or resistors that comprise the embedded filters and baluns, according to an example embodiment of the invention. In an embodiment of the invention, the filters and baluns may be embedded on internal conductive layers 318b-f. Because these transmission components need to be lower in dissipating energy, the organic materials utilized for organic dielectric layers 312-317 may be low-loss organic materials such as LCP or Teflon, perhaps with a dielectric constant (Er) in the range of 2-15, according to an example embodiment of the invention. In an example embodiment of the invention, the outer organic dielectric layers 312, 317 may be organic laminate layers. Additionally, the second package 303 may include discrete components 321 such as surface-mountable power amplifiers. In an embodiment of the invention, the surface-mountable power amplifier may be available as pre-tested component, perhaps as thin as 0.2 mm or less. Thermal vias 233 may be provided in the second package 302 to dissipate heat from the power amplifier. Further, one or more microvias 323 may be provided in the second package 302 to provide electrical connections between devices and/or layers, such as for electrically connecting a power amplifier to the embedded filters and baluns defined by one or more of conductive layers 318a-g.

The first package 302 may include a higher density of embedded components compared to the second package 303. For example, the first package 302 may include reception components such as filters and baluns before and after low-noise amplifiers (LNA). In order to obtain a higher density of embedded components, a higher dielectric constant organic material may be utilized for one or more of the organic layers 305-310. As described above, these higher dielectric constant organic materials may include high k organic materials or organic materials filled with other resistive/ceramic particles, according to an example embodiment of the invention. It will be appreciated that while some organic materials with high dielectric constants may have a higher loss, this may be acceptable for the reception components such as the filters and baluns before and after the LNA. Accordingly, the organic materials with high dielectric constants may be used for organic layers 305-310 that support conductive layers 311a-g utilized for the reception components. It will also be appreciated that low-loss materials may also be utilized for one or more organic dielectric layers 305-310 of the first package 302. In particular, there may be some components (e.g., diplexers, triplexers, duplexers, multiplexers, couplers, harmonic filters) that may require low-loss, and accordingly, these components may be patterned or circuitized on conductive layers 311a-g that are supported by the low-loss organic layers. It will also be appreciated that one or more discrete devices 320 such as a surface mountable low noise amplifier (LNA) may also be provided on an outer surface of the first package 320.

III. Alternative Embodiments of Multi-Package Systems

FIG. 4 illustrates a modular way of integration in a multi-package system, in accordance with an embodiment of the present invention. For example, the multi-package system may be utilized to implement a radio in accordance with an example embodiment of the invention. As shown in FIG. 4, there is a first package 402 and second package 403 that are electrically connecting using one or more electrical connectors 404.

The first package 402 may include a plurality of organic dielectric layers 405-410 and conductive layers 411a-g positioned adjacent to the organic dielectric layers 405-410, as illustrated in FIG. 4. Similarly, the second package 403 may include a plurality of organic dielectric layers 405-410 and conductive layers 417a-g positioned adjacent to the organic dielectric layers 405-410. Optionally, the first package 402 may include one or more high K organic layers 408, and the second package 403 may include one or more high K organic layers 415 as well. As similarly described above, conductive layers 411a-g and 417a-g may be utilized to form ground planes, supply voltage planes, or patterned or circuitized to form pads, traces, and embedded passive devices such as capacitors, inductors, and resistors, according to an example embodiment of the invention.

The presence of at least two packages 402 and 403 may allow for the partitioning of radio components between or among the at least two packages 402 and 403, according to an example embodiment of the invention. As shown in FIG. 4, the first package 402 may include discrete devices (e.g., a surface mount/wire-bonded device or component) on a surface of the first package 402. These discrete devices may include a power amplifier 420, a filter 421 (e.g., a SAW filter), and/or a transceiver 422, according to an example embodiment of the invention.

According to an example design in accordance with an example embodiment of the invention, the first package 402 may include high-valued decoupling capacitors and biasing and choke inductors that are formed on patterned using one or more of circuitized conductive layers 411a-g, according to an example embodiment of the invention. For example, these capacitors and inductors may be formed using conductive layers 411b and 411c, which sandwich organic dielectric layer 406. These capacitors and inductors may be utilized for biasing, decoupling, or for the operation of power amplifiers, low noise amplifiers, switches, and the like. By embedding these capacitors and inductors, the package 402 may maintain a compact form. In addition, the first package 402 may include a metal plane (e.g., conductive layer 411a) that carries the voltage supply required for one or more of the active components such as power amplifier 420, a transceiver 422, or a switch. In the first package 402, one or more organic layers 405-410 can be alternated with layers of complete ground planes forming very large distributed capacitances, which further reduces the number of decoupling capacitors that may be required, according to an example embodiment of the invention. These ground planes may be utilized to minimize supply noise to eliminate current or voltage spikes.

Still referring to the first package 402 of FIG. 4, DC blocking capacitors can also be formed on one or more conductive layers 411a-g. For example, DC blocking capacitors may be formed using conductive layers 411d and 411e, which sandwich a high K organic layer 408. The high K organic layer 408 may be comprised of polymer ceramic composites such as Teflon ceramic composites available from Rogers Corporation, according to an example embodiment of the invention. The range of capacitance that be achieved by the embedded DC block capacitor may be in the range of ~1-500 pF, according to an example embodiment of the invention. In addition, one or more biasing and/or electrostatic discharge (ESD) protection inductors may also be embedded in the first package 402 using one or more conductive layers 411a-g. In an embodiment of the invention, these inductors may be provided in the range of 1-100 nH.

It will also be appreciated that the first package 402 may also include additionally components that do not require tweaking or trimming or that otherwise have low tolerance requirements. Additionally, the first package 402 may also include thermal vias 424 and microvias 425. The thermal vias 424 may be used to dissipate heat from the power amplifier 420 or another active device. Likewise, the microvias may be utilized to connect a plurality of the conductive layers 411a-g.

According to an example design in accordance with an example embodiment of the invention, the second package 403 may serve an intelligent carrier/printed circuit board. The conductive layers 417a-f of the second package 403 may be circuitized or patterned to form embedded filters, diplexers, and baluns and other passive devices. These embedded components, which included the filters, diplexers, and baluns maybe high-precision components and require little variation for optimized performance. It will be appreciated that at least a portion of these high-precision components may be formed on an exposed conductive layer such as conductive layers 417a or 417f.

It will be appreciated that because a portion of the high-precision components may be exposed, they may be measured and tested as micro-strip type circuits, where internal layers of the second package 403 may serve as a ground or potential reference. Furthermore, because at least portion of the high-precision components may be exposed, they can also be tweak or trimmed after testing. For example, lasering techniques or redundant metallic structures may be altered in order adjust a parameter of the high-precision components, according to an example embodiment of the invention. However, because the high-precision components may be exposed, the devices in the second package 403 may be shielded from above according to an example embodiment of the invention. For example, the bottom conductive layer 411g of the first package 402 may form a shield for these components and eliminate a need for an external shield, according to an example embodiment of the invention.

It will be appreciated that other high-performing (e.g., high-Q) passive devices may be obtained using the internal conductive layers as well, including conductive layers 417b-e, according to an example embodiment of the invention. It will also be appreciated that the second package 403 may be constructed as a carrier that is the same size as the first package 402 to provided for a stacked module on a carrier.

According to an example embodiment of the invention, the organic dielectric layers 405-410 may generally have some organic layers that have a higher dielectric constant, and potentially more loss, than the organic dielectric layers 412-416. In particular, the higher dielectric constant (e.g., >20) organic materials, including the high K organic materials, may be utilized in the first package 402 to increase the density of the embedded components. The organic layers 405-410 may be heterogeneous, perhaps with some high K organic layers to increase density, along with some low-loss organic layers for other components (e.g., routing). On the other hand, the organic dielectric layers 412-416 may have a lower dielectric constant (e.g., ~2-15), and a lower loss, to provide for embedded components (e.g., passive devices) requiring high performance and/or high precision. According to an example embodiment of the invention, the organic dielectric layers 412-416 may be homogeneous in dielectric constant, loss tangent, coefficient of thermal expansion (CTE), and/or Young's modulus to obtain the highest performance. However, the materials may have different mechanical properties like melting temperature and glass transition temperature if the construction so requires it. Furthermore, the thickness of the organic dielectric layers 412-416 may likewise be varied if necessary. According to other embodiments of the invention, there may be some organic layers having low-loss organic materials with other layers having high K organic materials.

FIG. 5 shows an alternative embodiment of the multi-package system of FIG. 4, according to an example embodiment of the invention. In particular, FIG. 5 illustrates that packages may be attached on one or both sides of the second package 403 that may serve as an intelligent carrier/printed circuit board. As shown in FIG. 5, a third package 502 may be attached to the bottom side or surface of the second package 403. According to an example embodiment of the invention, the third package 502 may include components that could not be integrated using materials in the primary packages 402 and 403. This may include antennas, very high quality filters, and the like. Indeed, different materials may be required to construct these components which may be different than the materials utilized for the primary carrier package 403. According to an embodiment of the invention, these materials may include organic materials (e.g., filled or unfilled), ceramic materials, high permeability materials, and materials that change dielectric constant over voltage such as ferro- and para-magnetic ceramic materials. According to another example embodiment of the invention, the third package 502 may be constructed similarly to the primary packages 402, 403, but utilizing different organic materials (e.g., different dielectric constant, loss tangent, CTE, modulus, etc). The third package 502 may be electrically connected to the primary package 403 using stud bumps, balls, solder joints, etc. (or otherwise laminated, bonded, or connected), according to an example embodiment of the invention. Moreover, additional components, which may be surface mount components, may be attached on portions of the surface of the intelligent carrier/printed circuit board. For example, in FIG. 5, a surface mount component 504 may be provided on top side or surface of the package 403.

FIG. 6 illustrates another alternative embodiment of the multi-package system of FIG. 4. In particular, FIG. 6 provides for an example of the primary package 403 being fabricated with a rigid flex board 602. According to an example embodiment of the invention, the rigid flex board 602 may include an antenna formed thereon. Likewise, the rigid flex board 602 may also include integrated circuits (ICs) and/or surface mount components as well. It will be appreciated that the rigid flex board 602 may have sufficient flexibility to be coiled, perhaps around a casing of a device such as a handheld wireless device, according to an example embodiment of the invention.

FIG. 7 provides an alternative embodiment of a multi-package system, according to an example embodiment of the invention. In particular, FIG. 7 illustrates a primary first package 702 and two additional packages 704, 706 that are mounted to a bottom surface of the primary first package 702. According to an example embodiment of the invention, the second package and the third package 706 may include components that cannot be integrated using materials in the primary packages. Examples of these components may include antennas, very high Q filters, and the like. Different materials may be required to construct these components which may be different than the primary carries and the module layers. These materials could include ceramic materials, high permeability materials, materials that change dielectric constant over voltage such as ferro- and para-magnetic ceramic materials. According to an example embodiment of the invention, the second package 704 and the third package 706 may be connected to the primary first package 702 using stud bumps, balls, solder joints, or the like (including lamination, etc.). If stud bumps, balls, solder joints, or the like are utilized, they may be adjusted in size/height according to the size of the additional second packages.

It will be appreciated that many variations of the multi-package systems described above are available in other embodiments of the invention. For example, In yet another embodiment of the invention, all of the filters and active devices can be integrated into and onto a single organic substrate, therefore allowing one level of packaging to achieve all of the necessary functions. In essence all of the functions are now integrated at the card level, or board level which supports all of the filter functions and have the ICs mounted on both top and bottom side.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A stacked package device, comprising:
a first package having a plurality of first organic dielectric layers, the first package comprising at least one first conductive layer positioned between two of the plurality of first organic dielectric layers, the at least one first conductive layer patterned to form at least one first passive device;
a second package having a plurality of second organic dielectric layers, the second package comprising at least one second conductive layer positioned between two of the plurality of second organic dielectric layers, the at least one second conductive patterned to form at least one second passive device; and
an electrical connector positioned between a bottom surface of the first package and a top surface of the second package;
wherein the first package is electrically connected to the second package via the electrical connector;
the plurality of first organic dielectric layers comprises at least one large loss tangent organic layer;
the plurality of second organic dielectric layers comprises at least one low loss tangent organic layer; and
the large loss tangent organic layer has a loss tangent greater than the low loss tangent organic layer.

2. The device of claim 1, further comprising at least one surface mount device connected to an outer surface of the first package or the second package.

3. The device of claim 2, wherein the at least one surface mount device includes at least one active device.

4. The device of claim 2, wherein the at least one surface mount device includes at least one of a power amplifier, switch, a filter, and a transceiver.

5. The device of claim 2, further comprising at least one thermal via connected to the power amplifier, wherein the thermal via is provided within the first package or second package that includes the power amplifier.

6. The device of claim 1, wherein:
the at least one first passive device includes at least one of a decoupling capacitor, a biasing inductor, a choke inductor, or a DC blocking capacitor; and
the at least one second passive device includes a filter, diplexer, or balun.

7. The device of claim 1, wherein the at least one electrical connector includes one or more of stud bumps, balls, or solder joints, thereby providing a substantially hermetic seal between the bottom surface of the first package and the top surface of the second package.

8. The device of claim 1, wherein:
the at least one first conductive layer includes a plurality of first conductive layers; and
said system further comprises at least one via that electrically connects at least two of the plurality of first conductive layers.

9. The system device of claim 1, wherein:
the at least one large loss tangent organic layer comprises an organic material having a dielectric constant of greater than about 20; and
the at least one low loss tangent organic layer comprises an organic material having a dielectric constant in the range of about 2 to about 15.

10. A stacked package device, comprising:
a first package having a plurality of first organic dielectric layers, the first package comprising at least one first conductive layer positioned between two of the plurality of first organic dielectric layers, the at least one first conductive layer is patterned to form at least one first passive device;
a second package having a plurality of second organic dielectric layers, the second package comprising at least one second conductive layer positioned between two of the plurality of second organic dielectric layers, the at least one second conductive layer patterned to form at least one second passive device; and
means for electrically connecting the first package to the second package;
wherein the plurality of first organic dielectric layers comprises at least one large loss tangent organic layer;
the plurality of second organic dielectric layers comprises at least one low loss tangent organic layer; and
the large loss tangent organic layer has a loss tangent greater than the low loss tangent organic layer.

11. The device of claim 10, wherein:
the at least one large loss tangent organic layer comprises an organic material having a dielectric constant of greater than about 20; and
the at least one low loss tangent organic layer comprises an organic material having a dielectric constant in the range of about 2 to about 15.

* * * * *